(12) United States Patent
Kim et al.

(10) Patent No.: US 7,790,345 B2
(45) Date of Patent: *Sep. 7, 2010

(54) POSITIVE TYPE DRY FILM PHOTORESIST

(75) Inventors: Byoung-Kee Kim, Yongin-si (KR);
Se-Hyung Park, Seongnam-si (KR);
Jong-Min Park, Anyang-si (KR);
Seong-In Baek, Seoul (KR)

(73) Assignee: Kolon Industries, Inc., Kwacheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/791,886

(22) PCT Filed: Dec. 7, 2005

(86) PCT No.: PCT/KR2005/004170

§ 371 (c)(1),
(2), (4) Date: May 30, 2007

(87) PCT Pub. No.: WO2006/062347

PCT Pub. Date: Jun. 15, 2006

(65) Prior Publication Data

US 2008/0090168 A1    Apr. 17, 2008

(30) Foreign Application Priority Data

Dec. 9, 2004    (KR) .................. 10-2004-0103325

(51) Int. Cl.
*G03F 7/023* (2006.01)

(52) U.S. Cl. .............. 430/165; 430/166; 430/191; 430/192; 430/193

(58) Field of Classification Search ............ 430/165, 430/166, 191, 192, 193
See application file for complete search history.

(56) References Cited

U.S. PATENT DOCUMENTS

| 4,193,797 | A | | 3/1980 | Cohen et al. | |
| 4,587,199 | A | * | 5/1986 | Bennett | 430/260 |
| 5,077,174 | A | | 12/1991 | Bauer et al. | |
| 5,648,159 | A | * | 7/1997 | Sato | 428/327 |
| 5,981,135 | A | | 11/1999 | Koes et al. | |
| 6,037,100 | A | * | 3/2000 | Yu et al. | 430/273.1 |
| 6,468,716 | B1 | | 10/2002 | Sugie et al. | |
| 6,824,885 | B2 | * | 11/2004 | Fitch et al. | 428/483 |
| 2003/0087179 | A1 | * | 5/2003 | Iwasaki | 430/166 |

FOREIGN PATENT DOCUMENTS

| JP | 2004-115566 A | 4/2004 |
| WO | WO-89/05475 A1 | 6/1989 |

* cited by examiner

*Primary Examiner*—John S Chu
(74) *Attorney, Agent, or Firm*—Birch, Stewart, Kolasch & Birch, LLP (57) ABSTRACT

A positive type photoresist resin film includes a support film and a thermosetting positive type photoresist resin layer laminated over the support film. The positive type photoresist resin layer contains alkali soluble resin, a diazide based photosensitive compound and a sensitivity enhancer. The support film has a surface roughness that inhibits the formation of defect structures such as fish eye. The invention overcomes process inefficiencies and defects cause by spin coating photoresist technologies.

18 Claims, 2 Drawing Sheets

POSITIVE TYPE DRY FILM PHOTORESIST

FIELD OF THE INVENTION

A positive type photoresist resin film has excellent physical properties such as high film speed (or photosensitizing speed), development contrast, sensitivity, resolution and/or adhesion to a substrate.

BACKGROUND OF THE INVENTION

Photoresists and photoresist films are utilized in the manufacture of highly integrated semiconductors such as integrated circuits (ICs), Printed Circuit Boards (PCBs) and electronic display devices such as Cathode Ray Tubes (CRTs), color liquid crystal displays (LCDs) and organic electroluminescent displays (ELs or ELDs). The manufacturing processes for these devices use photolithography and photofabrication techniques. The photoresist films require a resolution sufficient to form a pattern with extremely fine lines and small space area not more than 7 µm.

The physical properties of photoresists can vary in such characteristics as solubility in a certain solvents, coloration, curing and the like via chemical modification of the molecular structure of the photoresist resin or the photoresist.

In recent years, processes for manufacturing TFT-LCDs using liquid photoresist compositions have become increasingly complicated and difficult as substrate sizes are increasing and the problems associated with liquid photoresist compositions have become more marked. Positive liquid photoresists exhibit problems such as reduced resolution and sensitivity due to sedimentation during storage, inferior pattern design due to residues on a coated surface, etc. Therefore, there exists a need to develop novel photoresists to solve such problems.

The desire for positive dry resist technology arose from the disadvantages associated with conventional liquid positive photoresists. These disadvantages led to elevated process costs. For example, spin coating a photoresist onto a semiconductor wafer results in losses of expensive photoresist material. The machinery for spin coating resists represents a substantial capital expense, and the time and management associated with spin coating results in additional process expense. The filtration associated with point-of-use application of photoresists is also cost-intensive. The wastage of photoresists at all points in the spin coating process also represents a substantial part of the photoresist cost. Also, positive liquid photoresist compositions generate insoluble materials (that is, undergoes sedimentation) during storage, leading to reduction of resolution and sensitivity. As a result, a practical dry film positive photoresist technology becomes highly desirable.

Conventional dry film photoresist technology began development during the 1960's when liquid negative photoresists were adapted to dry film technology for the manufacture of large featured, low resolution devices such as printed circuit board (PCB) patterns. However, the poor resolution of these negative dry film resists inhibited the application of dry film technology to high resolution applications such as ICs, LCDs etc.

Positive dry film resists first emerged during the 1980's, where technologies developed that exploited the properties of thermoplastic resins. For example, cellulose resins were utilized as the basis of dry film positive resists (U.S. Pat. No. 5,981,135). Additional dry film positive resists were developed by DuPont (U.S. Pat. No. 4,193,797 and U.S. Pat. No. 5,077,174), which were based upon acrylate or methacrylate resins. These related art thermoplastic positive dry film photoresists thus shared the disadvantages of the negative resists because utilizing cellulosic or acrylic resins yield a thick dry film photoresist that has low resolution.

As a result, application of these related art dry film in positive photoresists has proven problematic in regards to the thin films required for advanced semiconductor manufacturing applications. That is, as the photoresist layer widths necessarily become thinner for high resolution photolithography, the requirement for a uniform thin film increases. For example, a thin film of photoresist is more sensitive to external phenomena such as substrate roughness. A sufficiently non-uniform substrate can cause defects in the photoresist layer such as "fish eye".

Consequently, there is a strong need for improved photoresist films that overcome various problems such as thickness deviation of the coating layer, smoothness, distortion, coagulation, foaming, coating loss and the like, which are caused during necessary processes such as spin-coating or similar processes when forming micro patterns on LCDs, organic ELDs and the like when using conventional liquid positive type photoresist compositions. The improved photoresist films should also exhibit high resolution, excellent line width controllability, high thermal resistance, high sensitivity, improved film residual rate, high dry etching resistance and high development properties, and be applicable to micro-fine processing of LCDs, organic ELDs and the like.

SUMMARY OF INVENTION

Accordingly, it is an object of the invention to provide a positive type photoresist resin film which can solve the above problems by eliminating a complicated application process (for example, spin-coating) on a glass substrate required when a related art liquid photoresist composition is used to form micro-circuit patterns on a substrate such as those used in a TFT-LCD, an organic ELD and the like. The inventive dry film resist can form micro-circuit patterns exhibiting physical properties substantially equivalent or superior to those of related art liquid photoresist compositions, and which can adapt to the trend toward increasing substrate area used to form micro circuit patterns.

In accordance with the invention to achieve the object described above, there is provided a photoresist resin film containing a sufficiently smooth support film and a positive type photoresist resin layer laminated over the support film. More particularly, the positive type photoresist resin layer comprises an alkali soluble resin, a diazide based photosensitive compound and a sensitivity enhancer.

It is to be understood that both the foregoing general description and the following detailed description are exemplary and explanatory and are intended to provide further explanation of the invention as claimed.

DETAILED DESCRIPTION OF THE INVENTION

Advantages of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Hereinafter, the invention will be described in detail, especially, in view of technical construction thereof in conjunction with the accompanying drawings.

Figure 1:
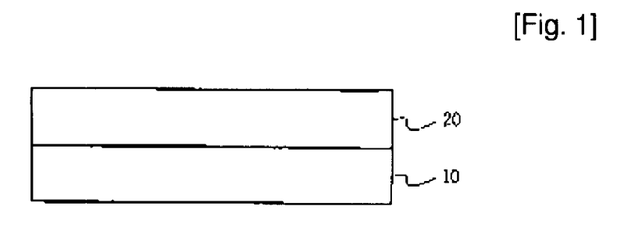
FIG. 1 illustrates a structure of a positive type photoresist resin film according to the invention.

FIG. 1 shows a positive type photoresist resin film that includes a support film 10 and a positive type photoresist resin layer 20 laminated over the support film 10. Occasionally, in order to improve safety of storage and transportation of the positive type photoresist resin film according to the invention, the film further includes a protective layer (not shown) over the photoresist resin layer 20. The positive type photoresist resin layer 20 can include an alkali soluble resin, a diazide based photosensitive compound and a sensitivity enhancer.

The positive type photoresist resin film with a laminated structure can eliminate spin-coating the photoresist onto a glass substrate, which is required when a related art liquid photoresist resin composition is used, thereby solving problems such as thickness deviation during coating, poor smoothness, distortion, coagulation, foaming, solvent exudation, etc. Utilizing a dry film resist additionally advantageously enhances product yield.

One of the properties of the support film 10 is a peak height (Rp).

The peak height (Rp) is defined as a height difference between a mean height of surface (MHt) and a height of a highest surface peak (q) located in the height profile(direction of z axis) of the selected area.

Hereinafter we refer the "peak height (Rp)" to "Rp".

Also, the mean height of surface (MHt) is defined as an average height of all the top peaks, bottom valleys and anomalous peaks located in the height profile (direction of z axis) of the selected area if anomalous peaks were present in the surface.

Figure 2:
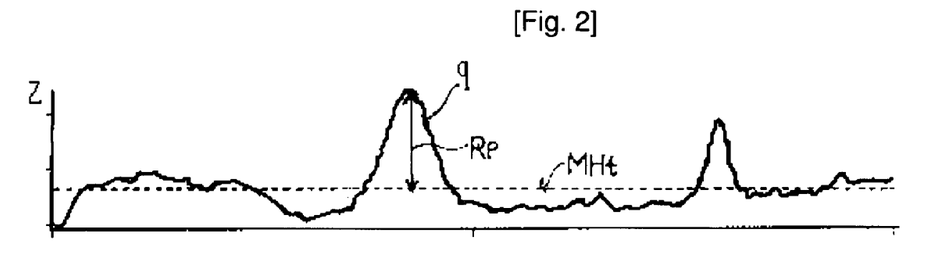
FIG. 2 shows a substrate film with a large anomaly.
Figure 3:
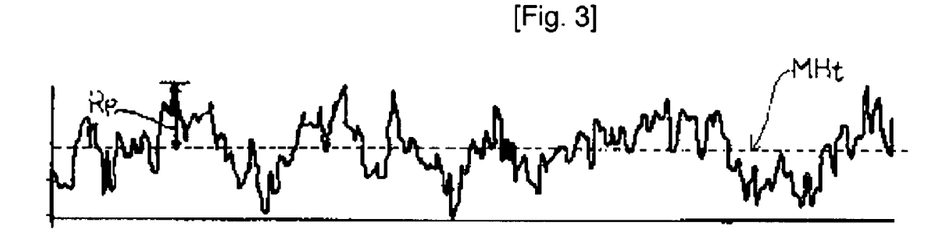
FIG. 3 shows a substrate film without a large anomaly.

FIG. 2 shows the surface with large anomalies of one type of support film 10.

In this case an anomalous peak q can be observed. The effect of this anomalous peak q would be to increase the value for Rp, even though the surface has low height of top peaks and bottom valleys in areas removed from the anomalous peak q.

Also, the presence of an anomaly q can be quite disadvantageous to the properties of a photoresist film formed on the support film 10. When the thickness of the photoresist film is large, the effect of a peak of the support film is minimal. However, as the photoresist film becomes thinner, the projection of a surface anomaly into the photoresist will cause the photoresist layer 20 to become non-uniform to result in the phenomena referred to as "fish eye". That is, as the layer of the photoresist film 20 is reduced to a thickness of about 10 μm, the presence of large anomalies in the support film 10 will tend to result in fish eye formation. As a result, the peak height (Rp) of the support film 10 should he not more than about 300 nm.

Also, the peak height (Rp) of the support film 10 may preferably be about 100 nm or less, although the invention is still effective at a peak height(Rp) of 30 nm (0.03 μm). Also, the peak height (Rp) is ideally reduced as much as is possible, even to 10 nm (0.01 μm) or less. However, a working range for the peak height (Rp) is from 15 to 30 nm.

Figure 4:
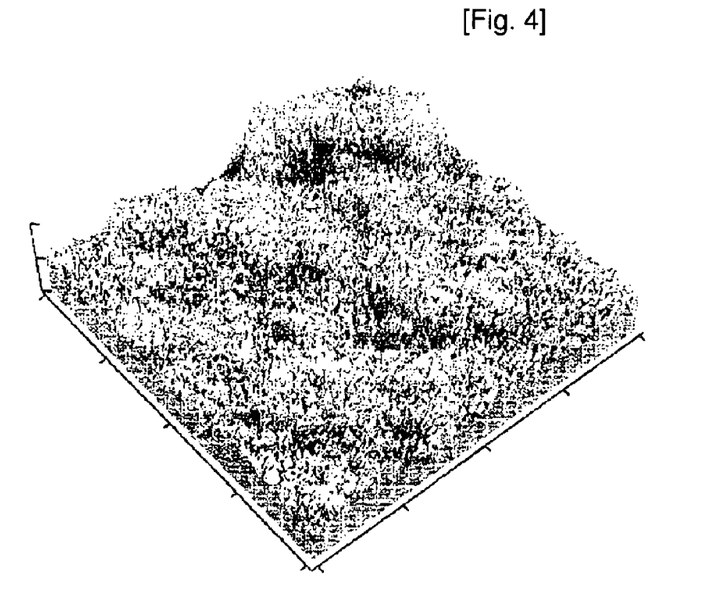
FIG. 4 shows an atomic force microscopy (AFM) micrograph of a substrate film without large anomalies.
Figure 5:
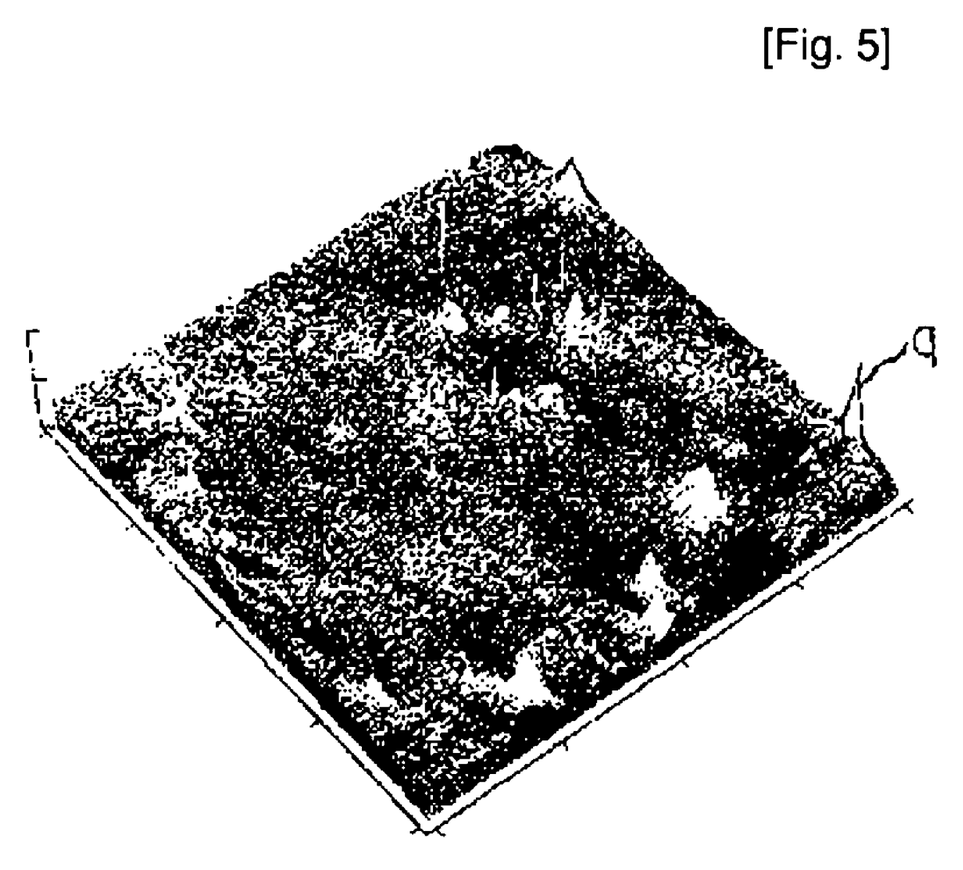
FIG. 5 shows an AFM micrograph of a substrate film with large anomalies.

FIG. 4 shows the surface of an oriented polypropylene (OPP) support film that is relatively free from large anomalies taken by atomic force microscopy (AFM). Here, the surface is relatively free from large anomalous peaks that can cause defect in the photoresist layer. In contrast, FIG. 5 shows an AFM micrograph of a polyethylene terephthalate (PET) film that shows the presence of large peaks rising above the mean height of surface (MHt). When these large peaks project into the photoresist layer, disadvantageous defect can result.

More particularly, the support film of the invention preferably has a peak height (Rp), defined a height difference between a mean height of surface (MHt) and height of the highest surface peak (q) located in the height profile(direction of z axis) of the selected area, of not more than about 300 nm by measuring with Atomic Force Microscope (AFM). The peak height (Rp) is more preferably not more than about 100 nm, which may be attained when an OPP or biaxial OPP (BOPP) film is used.

The mean height of surface (MHt) and peak height (Rp) are measured by Atom Force Microscope (AFM).

The Atom Force Microscope (AFM) generates attractive force or repulsive force according to lengthwise interval between atom of detector and atom of sample surface when micro detector fixed cantilever of AFM comes near to the suface of the supporting film.

By the above-mentioned phenomenon, the mean height of surface (MHt) and peak height (Rp) can be measured.

More detailly, the area of measuring(sample size) is defined as $20 \times 20 \mu m^2$.

The detector of AFM is contacted with the ten location selected optionally of the support film and the generated force of atom is measured by photodiode.

The mean height of surface (MHt) and peak height (Rp) are obtained by analyzing the generated force of atom measured by photodiode with second order fit.

At this time, Rp is an average of eight measured values excluding the maximum value and minimum value from the ten measured values.

If the Rp exceeds 300 nm, there may be a dimple or fish eye equal to the height of the highest surface peak on the surface of the photoresist layer when the substrate film is released from the photoresist layer after laminating the dry film resist, so that it causes a defect during development, after exposing the film to light.

Additionally, a high surface peak is also formed because of particles added (such as organic particles or inorganic particles) to improve smooth running properties in production of film, and/or other impurities generated during production of film.

The support film 10 of the invention should have satisfactory physical properties for the positive type photoresist resin film. Examples of suitable support film materials include, but are not restricted to, polycarbonate film, polyethylene (PE) film, polypropylene (PP) film, oriented polypropylene (OPP) film, polyethylene terephthalate (PET) film, polyethylene naphthalate (PEN) film, ethylene vinyl acetate (EVA) film, polyvinyl film, any suitable polyolefin film, epoxy film and the like. Particularly preferable polyolefin film is polypropylene (PP) film, polyethylene (PE) film, ethylene vinyl acetate (EVA) film, etc. A preferable polyvinyl film is polyvinyl chloride (PVC) film, polyvinyl acetate (PVA) film, polyvinyl alcohol (PVOH) film, etc. Particularly preferable polystyrene films are polystyrene (PS) film, acrylonitrile/butadiene/styrene (ABS) film, etc. Particularly, the support film is preferably transparent to allow light to pass through the support film and irradiate the photoresist resin layer.

The support film 10 may preferably have a thickness ranging from about 10 to 50 mm to serve as a framework for supporting shape of the positive type photoresist resin film, preferably a thickness ranging from about 15 to 50 mm, more preferably a thickness ranging from about 15 to 25 mm.

Next, the following discussion demonstrates constitutional ingredients of the positive type photoresist resin layer 20 according to the invention.

Resin materials can be thermoplastic or thermosetting. Thermoplastic is a type of plastic or resin that will repeatedly soften when heated and harden when cooled. The thermoplastic plastic or resin can be molded and shaped when heated, keeping its shape when cool. A thermosetting resin or plastic is a material that will undergo or has already undergone a chemical reaction through heat and/or catalysts to form a solid. Once the thermosetting material has been heated, it does not go back to its original state and does not soften when reheated.

The alkali soluble resin used to prepare the positive type photoresist resin layer 20 of the invention preferably includes, but is not limited to, a thermosetting novolac resin as a condensation product of phenols and aldehydes and, most preferably cresol novolac resin.

Novolac resin is obtained by polycondensation of phenols alone or in combination with aldehydes and an acidic catalyst.

Phenols include, but are not limited to, primary phenols such as phenol, o-cresol, m-cresol, p-cresol, 2,3-xylenol, 2,5-xylenol, 3,4-xylenol, 3,5-xylenol, 2,3,5-trimethylphenol-xylenol, 4-t-butylphenol, 2-t-butylphenol, 3-t-butylphenol, 4-methyl-2-t-butylphenol and the like; and polyhydric phenols such as 2-naphthol, 1,3-dihydroxy naphthalene, 1,7-dihydroxy naphthalene, 1,5-dihydroxyl naphthalene, resorcinol, pyrocatechol, hydroquinone, bisphenol A, phloroglucinol, pyrogallol and the like, which may be used alone or in combination. A combination of m-cresol and p-cresol is particularly preferred.

Suitable aldehydes include, but are not limited to, formaldehyde, trioxane, paraformaldehyde, benzaldehyde, acetaldehyde, propylaldehyde, phenylacetaldehyde, α or β-phenyl propylaldehyde, o-, m- or p-hydroxybenzaldehyde, glutaraldehyde, terephthalaldehyde and the like and may be used alone or in combination.

The cresol novolac resin for use in the invention preferably has a weight average molecular weight (based on GPC) ranging from 2,000 to 30,000.

In addition, the cresol novolac resin for use in the invention preferably has a meta/para-cresol content in a mixing ratio by weight ranging from 4:6 to 6:4, since the resin has varied physical properties such as photosensitizing speed and film residual rate dependent on the mixing ratio of the meta/para-cresol content.

If the meta-cresol content of the cresol novolac resin exceeds the above range, the photosensitizing speed may become higher while the film residual rate is rapidly lowered. On the other hand, the photosensitizing speed may become unfavorably slow when the para-cresol content exceeds the above range.

Although the cresol novolac resin having a meta/para-cresol content in the mixing ratio by weight ranging from 4:6 to 6:4 can be used alone, resins with different molecular weights in combination are more preferably used. In this case, the cresol novolac resin is preferably a mixture of (I) cresol novolac resin having a weight average molecular weight (based on GPC) ranging from 8,000 to 30,000 and (II) cresol novolac resin having a weight average molecular weight (based on GPC) ranging from 2,000 to 8,000 in a mixing ratio ranging from 7:3 to 9:1.

The term "weight average molecular weight" used herein refers to a conversion value of polystyrene equivalent determined by Gel Permeation Chromatography (GPC). If the weight average molecular weight is less than 2,000, the photoresist resin film may exhibit a dramatic thickness reduction in unexposed regions after development of the film. On the other hand, when the weight average molecular weight exceeds 30,000, the development speed may lower to thereby reduce sensitivity. The novolac resin of the invention can achieve the most preferable effects when a resin obtained after removing low molecular weight ingredients present in the reaction product has a weight average molecular weight within the range (of 2,000 to 30,000). In order to remove the low molecular weight ingredients from the novolac resin, conventional techniques known in the art including fractional precipitation, fractional dissolution, column chromatography and the like may be conveniently employed. As a result, performance of the photoresist resin film is improved, especially, scumming, thermal resistance, etc.

As an alkali soluble resin, the novolac resin can be dissolved in an alkaline solution without increase in volume and provides images exhibiting high resistance to plasma etching when the resin is used as a mask for the etching.

The diazide based photosensitive compound of the invention is used as a photosensitive material and, in addition, acts as a dissolution inhibitor to reduce alkali-solubility of the novolac resin. However, the diazide based photosensitive compound is converted into an alkali-soluble material when light is irradiated thereupon, thereby serving to increase the alkali-solubility of the novolac resin. Accordingly, the photosensitive compound is particularly useful for the positive type photoresist resin film due to alteration in solubility caused by light irradiation.

The diazide based photosensitive compound may be synthesized by esterification between a polyhydroxy compound and a quinonediazide sulfonic compound. The esterification for synthesizing the photosensitive compound comprises: dissolving the polyhydroxy compound and the quinonediazide sulfonic compound in a solvent such as dioxane, acetone, tetrahydrofuran, methylethylketone, N-methylpyrolidine, chloroform, trichloroethane, trichloroethylene or dichloroethane; condensing the prepared solution by adding a basic catalyst such as sodium hydroxide, sodium carbonate, sodium hydrogen carbonate, triethylamiine, N-methyl morpholine, N-methyl piperazine or 4-dimethyl aminopyridine to the solution; and washing, purifying and drying the resulting product. Desirable isomers can be selectively esterified and the esterification rate (average esterification rate) is not specifically limited, but is preferably in the range of 20 to 100% and more preferably 60 to 90% in terms of the esterification of the diazide sulfonic compound to OH groups of a polyhydroxy compound. When the esterification rate is too low, pattern structure and resolution may deteriorate. In contrast, deterioration of sensitivity may occur if the esterification rate is too high.

The quinonediazide sulfonic compound includes, for example, o-quinone diazide compounds such as 1,2-benzoquinone diazide-4-sulfonic acid, 1,2-naphthoquinone diazide-4-sulfonic acid, 1,2-benzoquinone diazide-5-sulfonic acid and 1,2-naphthoquinone diazide-5-sulfonic acid; and other quinone diazide sulfonic derivatives.

The quinonediazide sulfonic compound functions as a dissolution inhibitor to decrease the solubility of novolac resin in alkaline solutions. However, said compound is decomposed to produce alkali soluble resin during an exposure process and, thereby has a characteristic of accelerating the dissolution of novolac resin in an alkaline solution.

As the polyhydroxy compound, preferred examples are trihydroxybenzophenones such as 2,3,4-trihydroxybenzophenone, 2,2',3-trihydroxy benzophenone, 2,3,4'-trihydroxybenzophenone; tetrahydroxybenzophenones such as 2,3,4,4-tetrahydroxybenzophenone, 2,2',4,4'-tetreahydroxybenzophenone, 2,3,4,5-tetrahydroxybenzophenone; pentahydroxybenzophenones such as 2,2',3,4,4'-pentahydroxybenzophenone, 2,2',3,4,5-pentahydroxybenzophenone; hexahydroxybenzophenones such as 2,3,3',4,4',5'-hexahydroxybenzophenone, 2,2,3,3',4,5'-hexahydroxybenzophenone; gallic alkylester; oxyflavans, etc.

The diazide based photosensitive compound for use in the invention is preferably at least one selected from a group containing 2,3,4,4-tetrahydroxybenzophenone-1,2-naphthoquinonediazide-sulfonate, 2,3,4-trihydroxybenzophenone-1,2-naphthoquinonediazide-5-sulfonate and (1-[1-(4-hydroxyphenyl)isopropyl-]-4-[1,1-bis(4-hydroxyphenyl)ethyl]benzene)-1,2-naphthoquinonediazide-5-sulfonate. Also, the diazide based photosensitive compound prepared reacting polyhydroxybenzophenone and a diazide based compound such as 1,2-naphto quinonediazide, 2-diazo-1-naphthol-5-sulfonic acid may he used.

The diazide based photosensitive compounds are described in Chapter 7 of Light Sensitive Systems, Kosar, J.; John Wiley & Sons, New York, 1965.

Such diazide based photosensitive compounds (that is, sensitizers) used as a constitutional ingredient of the positive type photoresist resin layer according to the invention is selected from substituted naphthoquinone diazide based sensitizers generally employed in positive type photoresist resin compositions, which is disclosed in, for example, U.S. Pat. Nos. 2,797,213; 3,106,465; 3,148,983; 3,201,329; 3,785,825; and 3,802,885, etc.

The diazide based photosensitive compound described above is used alone or in combination in an amount of 30 to 80 parts by weight, based on 100 parts by weight of the alkali soluble resin. If less than 30 parts by weight of the diazide based photosensitive compound is used, the compound may not undergo development in a developing solution and exhibits drastically reduced residual rate of the photoresist film. In contrast, if the amount exceeds 80 parts by weight, costs are too high, thus being economically disadvantageous and, in addition, the solubility in the solvent becomes lower.

Such a diazide based photosensitive compound is capable of controlling photosensitizing speed of the positive type photoresist resin film according to the invention by procedures including, for example, the control of amount of the photosensitive compound and the control of esterification between the polyhydroxy compound such as 2,3,4-trihydroxybenzophenone and the quinonediazide sulfonic compound such as 2-diazo-1-naphthol-5-sulfonic acid.

The diazide based photosensitive compound reduces the solubility of alkali soluble resin in an aqueous alkali developing solution to about 1/100th that prior to exposure. However, after the exposure, the compound is converted into a carboxylic acid soluble in the alkaline solution, thereby exhibiting a solubility increase of about 1000 to 1500 fold, compared to non-exposed positive type photoresist compositions. The above characteristic is preferably employed in formation of micro-circuit patterns for devices such as LCDs, organic ELDs and the like. More particularly, a photoresist applied over a silicon wafer or a glass substrate is subjected to UV irradiation through a semi-conductor mask in a circuit form, and then is treated using the developing solution, resulting in a desired circuit pattern remaining on the silicon wafer or the glass substrate.

A sensitivity enhancer may be used for improving the sensitivity of the positive type photoresist resin film. The sensitivity enhancer may be a polyhydroxy compound which contains 2 to 7 phenol based hydroxy groups and has a weight average molecular weight less than 1,000 relative to polystyrene. Preferred examples arc at least one selected from a group consisting of 2,3,4-trihydroxybenzophenone, 2,3,4,4-tetrahydroxybenzophenone, 1-[1-(4-hydroxyphenyl)isopropyl]-4-[1,1-bis(4-hydroxyphenyl)ethyl]benzene.

The polyhydroxy compound serving as the sensitivity enhancer is preferably used in an amount of 3 to 15 parts by weight based on 100 parts by weight of the alkali soluble resin. If less than 3 parts by weight of the polyhydroxy compound is used, it may exhibit insignificant photosensitizing effects and unsatisfactory resolution and sensitivity. When the amount exceeds 15 parts by weight, it may exhibit high sensitivity but narrows the window processing margin.

In addition the resin composition may contain other components or additives, including leveling agents, fillers, pigments, dyes, antioxidants, and the like.

In the invention, the positive type photoresist resin layer 20 may be prepared by mixing the composition containing the alkali soluble resin, the diazide based photosensitive compound and the sensitivity enhancer, all of which are described above, with a constant amount of solvent. The mixture is applied to the support film 10 at a thickness of about 5 to 20 μm.

The process to form the positive type photoresist resin layer on the support film comprises coating the support film with the admixture of the present inventive composition and the solvent by way of generally known coating methods using a roller, roll coater, meyer rod, gravure, sprayer, etc.; and drying the coated film to volatilize the solvent. If required, the applied composition may be treated by heating and curing.

The positive type photoresist resin film is usually adhered to a surface of the substrate by means of lamination and subjected to light irradiation prior to releasing the support film, followed by releasing the support film. Otherwise, after laminating the positive type resin film and releasing the support film, the positive type photoresist resin film may be subjected to light irradiation. However, the irradiation can be either before or after the support film is removed.

Moreover, the prepared positive type photoresist resin film may further comprise a protective layer formed on top of the positive type photoresist resin layer. Such a protective layer serves to block air penetration and protect the positive type photoresist resin layer from impurities or contaminants and is preferably a polyethylene film, polyethylene terephthalate film, polypropylene film, etc. and preferably has a thickness ranging from 15 to 30 μm.

Meanwhile, the process for forming patterns using the inventive photoresist resin film comprises:

(1) a step of forming the photoresist resin film, which is prepared by applying a photoresist resin layer to a support film, on a glass substrate and, optionally, releasing the support film from the photoresist resin film;

(2) a step of irradiating the prepared coating with UV irradiation through a mask or directly irradiating the prepared coating with UV irradiation not through a mask to generate a desired pattern; and (3) a step of forming a resist patterned coating which comprises removing the positive type photoresist resin coating in the UV irradiation portions by development after releasing the support film, in case that the support film was not released from the photoresist resin film.

A preferred example of the developing solution is 2.38% TMAH (tetra-methyl-ammonium hydroxide) for developing the positive type photoresist resin film according to the invention.

In step (1), adhering the positive type photoresist resin film to the substrate positions the photoresist resin layer close to the support film, thereby completing formation of the positive type photoresist resin coating. The support film needs not be released. In addition, the photoresist resin coating formed on the substrate need not be dried.

Consequently, the desired resist patterned coating is formed through steps (1), (2) and (3).

The prepared positive type photoresist resin film comprising the photoresist resin layer on the support film solves problems such as reduced resolution or sensitivity during storage of the composition typically generated when using conventional liquid photoresist resin compositions, or eliminates the spin coating and/or drying processes conventionally required when applying a composition to the glass substrate, so that the invention can solve disadvantages of thickness deviation and foaming at the drying process, improve product yield and, especially, remarkably reduce processing costs.

The micro circuit pattern formed using the positive type photoresist resin film according to the invention exhibits high resolution on the order of 2 to 7 μm, substantially similar or better to that of related art liquid positive type photoresist resin compositions, and therefore can be employed in fabrication of micro circuits such as LCDs, organic ELDs and the like.

BRIEF DESCRIPTION OF THE DRAWINGS

Other objects and aspects of the invention will become apparent from the following description of embodiments with reference to the accompanying drawings in which.

The above described features and other advantages of the invention will become more apparent from the following non-restrictive examples. However, it should be understood that these examples are intended to illustrate the invention more fully as practical embodiments and do not limit the scope of the invention.

EXAMPLE 1

A solution was prepared containing cresol novolac resin which has a meta/para-cresol content in a mixing ratio by weight of 4:6 and has (I) cresol novolac resin having a weight average molecular weight of 8,000 and (II) cresol novolac resin having a weight average molecular weight of 2,000 in a mixing ratio of 7:3 as the alkali soluble resin; 40 parts by weight of 2,3,4-trihydroxybenzophenone-1,2-naphthoquinonediazide-5-sulfonate as the photosensitive compound; 5 parts by weight of 2,3,4,4-tetrahydroxybenzophenone as the sensitivity enhancer; and the balance of a solvent, dye and/or a leveling agent based on 100 parts by weight of the above alkali soluble resin. The prepared solution was subjected to filtering through a 0.2 μm Millipore TEFLON (polytetrafluoroethylene) filter to remove insoluble materials. The resultant solution was applied to a polyethylene terephthalate (PET) film (19 μm thickness) at a thickness of 5 μm to form a photoresist resin layer, thereby producing a positive type photoresist resin film.

EXAMPLE 2

A positive type photoresist resin film was prepared in the same manner as in Example 1, except that the alkali soluble resin was a cresol novolac resin having a meta/para-cresol content in a mixing ratio by weight of 4:6 and containing (I) cresol novolac resin having a weight average molecular weight of 10,000 and (II) cresol novolac resin having a weight average molecular weight of 3,000 in a mixing ratio of 7:3; and the photosensitive compound was 40 parts by weight of 2,3,4,4-tetrahydroxybenzophenone-1,2-naphthoquinonediazide-sulfonate based on 100 parts by weight of the alkali soluble resin.

EXAMPLE 3

A positive type photoresist resin film was prepared in the same manner as in Example 1, except that the alkali soluble resin was a cresol novolac resin having a meta/para-cresol content in a mixing ratio by weight of 4:6 and containing (I) cresol novolac resin having a weight average molecular weight of 12,000 and (II) cresol novolac resin having a weight average molecular weight of 4,000 in a mixing ratio of 7:3; and the photosensitive compound was 40 parts by weight of 1-[1-(4-hydroxyphenyl)isopropyl]-4-[1,1-bis(4-hydroxyphenyl)ethyl]benzene)1,2-naphthoquinonediazide-5-sulfonate based on 100 parts by weight of the alkali soluble resin.

EXAMPLE 4

A positive type photoresist resin film was prepared in the same manner as in Example 1, except that the alkali soluble resin was a cresol novolac resin having a meta/para-cresol content in a mixing ratio by weight of 5:5 and containing (I) cresol novolac resin having a weight average molecular weight of 14,000 and (II) cresol novolac resin having a weight average molecular weight of 5,000 in a mixing ratio of 8:2; and the photosensitive compound was 20 parts by weight of 2,3,4-trihydroxybenzophenone-1,2-naphthoquinonediazide-5-sulfonate and 20 parts by weight of 2,3,4,4-tetrahydroxybenzophenone-1,2-naphthoquinonediazide-sulfonate based on 100 parts by weight of the alkali soluble resin.

EXAMPLE 5

A positive type photoresist resin film was prepared in the same manner as in Example 1, except that the alkali soluble resin was a cresol novolac resin having a meta/para-cresol content in a mixing ratio by weight of 5:5 and containing (I) cresol novolac resin having a weight average molecular weight of 18,000 and (II) cresol novolac resin having a weight average molecular weight of 6,000 in a mixing ratio of 8:2; and the photosensitive compound was 20 parts by weight of 2,3,4-trihydroxybenzophenone-1,2-naphthoquinonediazide-5-sulfonate and 20 parts by weight of 1-[1-(4-hydroxyphenyl)isopropyl]-4-[1,1-bis(4-hydroxyphenyl)ethyl]benzene) 1,2-naphthoquinonediazide-5-sulfonate based on 100 parts by weight of the alkali soluble resin.

EXAMPLE 6

A positive type photoresist resin film was prepared in the same manner as in Example 1, except that the alkali soluble resin was a cresol novolac resin having a meta/para-cresol content in a mixing ratio by weight of 5:5 and containing (I) cresol novolac resin having a weight average molecular weight of 18,000 and (II) cresol novolac resin having a weight average molecular weight of 7,000 in a mixing ratio of 8:2; and the sensitivity enhancer was 5 parts by weight of 1-[1-(4-hydroxyphenyl)isopropyl]-4-[1,1-bis(4-hydroxyphenyl) ethyl]benzene) based on 100 parts by weight of the alkali soluble resin.

Each of the obtained positive type photoresist resin films from Examples 1 to 6 was laminated onto a substrate with lamination speed of 0.5 to 3.5 m/min, at a temperature of 100 to 130° C. and under a heating roller pressure of 10 to 90 psi, exposed to UV irradiation using a photomask and subjected to development in 2.38% TMAH (Tetra-Methyl-Ammonium Hydroxide) after releasing the support film, resulting in formation of a micro pattern. Physical properties of the formed pattern were evaluated according to the following methods and the results are shown in Table 1.

Evaluation of Physical Properties

Physical properties of the positive type patterns produced in Examples 1 to 6 were evaluated according to the following methods and the results are shown in Table 1.

(1) Sensitivity

After exposing each of the prepared positive type resin films to UV irradiation with varied light amount, the film was developed using 2.38% by mass of TMAH solution for 60 seconds, washed for 30 seconds then dried. The exposure amount of the resulting film was measured using an optical microscope.

(2) Thermal Resistance

After formation of a resist pattern by the same manner for evaluating the sensitivity, the resist pattern was placed on a hot plate at 150° C. and subjected to heating for 2 minutes. A Scanning Electron Microscope (SEM) was used to observe cross-sections of the resist patterns while using a-step for observing surface of the resist pattern.

The condition of the resist patterns was evaluated as follows: ⊚ when variation in shape and surface of the resist pattern is not more than 3% after heating; Δ for a variation ranging from 3 to 5%; and X for a variation greater than 10%, relative to thickness of the pattern.

(3) Resolution

After lamination of the prepared positive type photoresist resin film onto the substrate at a lamination speed of 0.5 to 3.5 m/min, at a temperature of 100 to 130° C. and under a heating roller pressure of 10 to 90 psi, the laminated film was subjected to UV irradiation using the photomask and releasing polyethylene terephthalate (PET) film as the support film. Subsequently, the photoresist resin film was developed using 2.38% TMAH alkali developer, thereby resulting in a micro circuit with unexposed regions. Resolution of the formed pattern was observed using a scanning electron microscope.

TABLE 1

Comparison of sensitivity, thermal resistance and resolution.

| | Sensitivity (mJ/cm$^2$) | Thermal resistance evaluation | Resolution (μm) |
|---|---|---|---|
| Example 1 | 59.7 | ⊚ | 4.5 |
| Example 2 | 63.2 | ⊚ | 5.2 |
| Example 3 | 60.5 | ⊚ | 4.8 |
| Example 4 | 58.6 | ⊚ | 4.8 |
| Example 5 | 61.5 | ⊚ | 5.5 |
| Example 6 | 60.8 | ⊚ | 5.2 |

As shown in Table 1, the micro circuit patterns formed with the positive type photoresist resin films according to Examples 1 to 6, each of which contains the photoresist resin layer on the support film, exhibit excellent characteristics such as sensitivity, thermal resistance and resolution. Accordingly, the photoresist resin film of the invention can form a micro circuit pattern on a substrate used in devices such as LCDs or organic ELDs.

EXAMPLE 7

A positive type photoresist composition for forming a positive type photoresist layer is prepared as follows.

A solution was prepared containing: a cresol novolac resin which has a meta/para-cresol content in a mixing ratio by weight of 4:6 and includes (I) cresol novolac resin having a weight average molecular weight of 8,000 and (II) cresol novolac resin having a weight average molecular weight of 2,000 in a mixing ratio of 7:3 as the alkali soluble resin; 40 parts by weight of 2,3,4-trihydroxybenzophenone-1,2-naphthoquinonediazide-5-sulfonate as the photosensitive compound; 5 parts by weight of 2,3,4,4-tetrahydroxybenzophenone as the sensitivity enhancer; and the balance of a solvent, dye and/or a leveling agent based on 100 parts by weight of the above alkali soluble resin. The prepared solution was subjected to filtering through a 0.2 μm Millipore TEFLON (polytetrafluoroethylene) filter to remove insoluble materials. The resultant solution was applied to a BOPP (bi-axially oriented polypropylene) film having physical properties listed in Table 2 and Table 3 as the support film in thickness of 5 μm to form a positive type photoresist layer, thereby producing the positive type photoresist dry film.

TABLE 2

Comparison of thermal and mechanical properties in the support film.

| Physical properties | OPP | PET |
|---|---|---|
| Thickness (μm) | 30 | 19 |
| Melting point (° C.) | 171.4 | 251.4 |

(PET physical properties mean physical properties of PET used in Examples 1 to 6)

TABLE 3

Measuring results for MHt and Rp of BOPP film used in Example 7.

| Region Group | Rp-v [μm] | Rms rough [μm] | Ave rough [μm] | MHt [μm] | Rp [μm] | Valley(Rv) [μm] |
|---|---|---|---|---|---|---|
| OPP-1 | 0.0804 | 0.0077 | 0.0061 | 0.0322 | 0.0482 | −0.0322 |
| OPP-2 | 0.0789 | 0.0080 | 0.0063 | 0.0343 | 0.0446 | −0.0343 |
| OPP-3 | 0.1198 | 0.0081 | 0.0061 | 0.0461 | 0.0737 | −0.0461 |
| OPP-4 | 0.1438 | 0.0084 | 0.0063 | 0.0480 | 0.0958 | −0.0480 |
| OPP-5 | 0.0650 | 0.0064 | 0.0050 | 0.0272 | 0.0378 | −0.0272 |
| OPP-6 | 0.1028 | 0.0099 | 0.0076 | 0.0479 | 0.0549 | −0.0479 |
| OPP-7 | 0.0759 | 0.0069 | 0.0054 | 0.0288 | 0.0471 | −0.0288 |
| OPP-8 | 0.0728 | 0.0075 | 0.0059 | 0.0321 | 0.0407 | −0.0321 |
| Average | 0.0924 | 0.0079 | 0.0061 | 0.0371 | 0.0554 | −0.0371 |

TABLE 4

Measuring results for MHt and Rp of PET film used in Example 1 to 6.

| Region Group | Rp-v [μm] | Rms rough [μm] | Ave rough [μm] | MHt [μm] | Rp [μm] | Valley(Rv) [μm] |
|---|---|---|---|---|---|---|
| PET-1 | 0.2322 | 0.0112 | 0.0072 | 0.0732 | 0.1590 | −0.0732 |
| PET-2 | 0.4342 | 0.0210 | 0.0101 | 0.2584 | 0.1757 | −0.2584 |
| PET-3 | 0.1724 | 0.0065 | 0.0037 | 0.0444 | 0.1280 | −0.0444 |
| PET-4 | 0.2009 | 0.0131 | 0.0088 | 0.0613 | 0.1396 | −0.0613 |
| PET-5 | 0.1340 | 0.0053 | 0.0034 | 0.0336 | 0.1003 | −0.0336 |
| PET-6 | 0.1161 | 0.0040 | 0.0025 | 0.0249 | 0.0913 | −0.0249 |
| PET-7 | 0.1602 | 0.0046 | 0.0024 | 0.0415 | 0.1187 | −0.0415 |
| PET-8 | 0.1378 | 0.0059 | 0.0030 | 0.0420 | 0.0958 | −0.0420 |
| Average | 0.1985 | 0.0089 | 0.0051 | 0.0724 | 0.1260 | −0.0724 |

In the Table 3-4, Rp-v is a distance between maximum peak height and minimum valley height located in the height profile (direction of z axis) of the selected area.

Rms rough is a standard derivation of datas with 8 numbers against mean height of surface (MHt) and Ave rough is an average derivation of datas with 8 numbers against mean height of surface (MHt).

Valley (Rv) is a distance between minimum valley height and mean height of surface (MHt) located in the height profile (direction of z axis) of the selected area.

Definition of Rp and MHt are already described.

Evaluation of Physical Properties

Physical properties of the support film used in the invention were evaluated according to the following methods. [Melting point]

Melting point of the prepared film is measured through difference in heat flow using a differential scanning calorimeter to apply the same temperature program to a sample and inert reference material.

[Height of Protrusion]

The prepared film is subjected to analysis of interatomic repulsive force with a micro probe using AFM three times, thereby calculating mean value of the highest surface point and the lowest surface point and determining surface roughness of the film.

Thermal and mechanical properties of the support film were compared each other and the results are shown in Table 2 above.

Physical properties of the positive type photoresist film produced in the above example were evaluated according to the following methods and the results are shown in Table 3.

[Film Release Properties]

After lamination of the prepared positive type photoresist dry film onto a glass substrate coated with ITO to a depth of 2000 and a width of 100×100 mm$^2$ at a lamination speed of 2 m/min, at a temperature of 110° C. under a heating roller pressure of 10 to 90 psi, the support film was peeled off from the photoresist layer. By evaluating release properties of the dry film using UTM (Universal Test Machine; Instron Inc.), peeling strength of the film during releasing was determined by UTM.

[Sensitivity]

After exposing the laminated substrate to light with varied light amount, the film was developed using 2.38% by mass of TMAH solution at ambient temperature for 60 seconds, washed for 30 seconds and then dried. Exposure amount of the resulting film was measured using an optical microscope.

[Thermal Resistance]

After formation of a resist pattern by the same manner for evaluating the sensitivity, the resist pattern was placed on a hot plate at 150° C. and subjected to heating for 2 minutes. A Scanning Electron Microscope (SEM) was used to observe cross-sections of the resist patterns while using a-step for observing surface of the resist pattern.

The condition of the resist patterns was evaluated as follows: "good" when variation in shape and surface of the resist pattern is not more than 3% after heating; "fair" for a variation ranging from 3 to 5%; and "poor" for a variation greater than 10%, relative to thickness of the pattern.

[Resolution]

After lamination of the prepared film onto the substrate at a lamination speed of 2.0 m/min, at a temperature of 110° C. 10 and under a heating roller pressure of 10 to 90 psi, the laminated film was subjected to UV irradiation using a photomask and peeling off PET film as the support film. Subsequently, the treated film was developed using 2.38% TMAH alkaline developer, thereby resulting in a micro circuit with unexposed regions. Resolution of the resultant micro circuit was observed using a scanning electron microscope.

TABLE 5

Comparison of physical properties of positive type photoresist dry films.

| Physical properties | Example 7a | Example 7b |
|---|---|---|
| Film release properties(kg/100 × 100 mm$^2$) | 0.0587 | 0.0688 |
| Sensitivity (mJ/cm$^2$) | 59.7 | 59.7 |
| Evaluation of thermal resistance | Good | Good |
| Resolution | 4.4 | 4.5 |

Compared to the use of conventional liquid photoresist resin compositions, the invention exhibits physical properties such as photosensitizing speed, development contrast, resolution, adhesiveness to a substrate, film residual rate, circuit line width uniformity (CD uniformity), etc. equal or superior to those of the conventional compositions in formation of micro circuit patterns on a substrate used in devices such as LCDs, organic ELDs and the like, thereby offering an improved positive type photoresist resin film suitable for use in lithography of TFT-LCDs, organic ELDs and the like.

Additionally, using the positive type photoresist resin film can eliminate spin-coating processes and drying processes required in formation of micro circuit patterns using conventional liquid photoresist resin compositions. Accordingly, the invention can solve typical problems of the above processes such as thickness deviation, poor smoothness, distortion, coagulation, foaming at drying and solvent output, etc. The invention simplifies the fabrication process since the spin-coating and drying processes are not required, thereby enhancing workability and economic benefit.

Furthermore, the positive type photoresist resin film of the invention has no problems associated with resolution and/or sensitivity reduction which is caused by difficulty in storage of the related art liquid compositions.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

The invention claimed is:

1. A positive type dry film resist, comprising:
a support film; and
a positive type photoresist layer on and in contact with the support film,
wherein the support film has a peak height (Rp), defined as a height difference between a mean height of surface (MHt) and a height of a highest surface peak located in the height profile (direction of z axis) of the selected area, of not more than about 300 nm, and a thickness of the positive type photoresist layer is not more than 10 µm.

2. The positive type dry film resist according to claim 1, wherein the peak height (Rp) is not more than about 100 nm.

3. The positive type dry film resist according to claim 1, wherein a thickness of the support film ranges from about 15 to 50 µm.

4. The positive type dry film resist according to claim 1, wherein the positive type photoresist layer is composed of alkali soluble resin.

5. The positive type dry film resist according to claim 4, wherein the resin is novolac resin.

6. The positive type dry film resist according to claim 4, wherein the positive type photoresist layer is composed of cresol novolac resin.

7. The positive type dry film resist according to claim 1, wherein the positive type photoresist layer is a positive type photoresist composed of alkali soluble resin, a diazide based photosensitive compound and a sensitivity enhancer.

8. The positive type dry film resist according to claim 7, wherein the positive type photoresist resin layer comprises 30 to 80 parts by weight of the diazide based photosensitive compound and 3 to 15 parts by weight of the sensitivity enhancer, based on 100 parts by weight of the alkali soluble resin.

9. The positive type dry film resist according to claim 7, wherein the diazide based photosensitive compound is at least one selected from a group consisting of 2,3,4,4-tetrahydroxybenzophenone-1,2-naphthoquinonediazide-sulfonate, 2,3,4-trihydroxybenzophenone-1,2-naphthoquinonediazide-5-sulfonate and (1-[1-(4-hydroxyphenyl)-isopropyl]-4-[1,1-bis(4-hydroxyphenyl)ethyl]benzene)-1,2-naphthoquinonediazide-5-sulfonate.

10. The positive type dry film resist according to claim 6, wherein the cresol novolac resin has a weight average molecular weight (based on GPC) ranging from 2,000 to 30,000.

11. The positive type dry film resist according to claim 6, wherein the cresol novolac resin has a meta/para-cresol content in a mixing ratio by weight ranging from 4:6 to 6:4.

12. The positive type dry film resist according to claim 6, wherein the cresol novolac resin is a mixture of (I) cresol novolac resin having a weight average molecular weight (based on GPC) ranging from 8,000 to 30,000 and (II) cresol novolac resin having a weight average molecular weight (based on GPC) ranging from 2,000 to 8,000 in a mixing ratio by weight ranging from 7:3 to 9:1.

13. The positive type dry film resist according to claim 7, wherein the sensitivity enhancer is at least one selected from a group consisting of 2,3,4-trihydroxybenzophenone, 2,3,4,4-tetrahydroxybenzophenone and (1-[1-(4-hydroxyphenyp-isopropyl]-4-[1,1-bis(4-hydroxyphenyl)ethyl]benzene).

14. The positive type dry film resist according to claim 1, wherein the support film is composed of polyethylene terephthalate, polyethylene naphthalate, polycarbonate, ethylene vinyl acetate, ethylene vinyl alcohol, polyvinyl chloride, polyvinyl acetate, polyvinyl alcohol, polystyrene, acrylonitrile/butadiene/styrene, epoxy or a polyolefin selected from the group consisting of polyethylene, polypropylene and oriented polypropylene.

15. The positive type dry film resist according to claim 1, wherein the dry film resist further comprise a protective layer formed on top of the photoresist layer.

16. The positive type dry film resist according to claim 15, wherein the protective layer is composed of polyethylene, polyethylene terephthalate or polypropylene.

17. The positive type dry film resist according to claim 15, wherein a thickness of the protective layer ranges from about 15 to 30 μm.

18. The positive type dry film resist according to claim 1, wherein the positive type photoresist layer contains a thermosetting polymer.

* * * * *